(12) United States Patent
Chia et al.

(10) Patent No.: US 6,285,077 B1
(45) Date of Patent: Sep. 4, 2001

(54) MULTIPLE LAYER TAPE BALL GRID ARRAY PACKAGE

(75) Inventors: Chok J. Chia, Cupertino; Seng-Sooi Allen Lim, San Jose; Qwai Hoong Low, Cupertino, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/377,887

(22) Filed: Aug. 19, 1999

(51) Int. Cl.[7] ................. H01L 23/48; H01L 23/495; H01L 29/40
(52) U.S. Cl. ................. 257/700; 257/780; 257/781; 257/782; 257/748; 257/666; 257/673; 257/676; 257/778; 257/774; 257/697
(58) Field of Search ..................... 257/780, 781, 257/782, 748, 666, 673, 676, 778, 774, 700, 697

(56) References Cited

U.S. PATENT DOCUMENTS

| | | | |
|---|---|---|---|
| 5,844,168 | * 12/1998 | Schueller | 174/52.4 |
| 5,990,545 | * 11/1999 | Schueller | 257/697 |
| 6,011,694 | * 1/2000 | Hirakawa | 361/774 |
| 6,048,753 | * 4/2000 | Farnworth | 438/111 |
| 6,069,407 | * 5/2000 | Hamzehdoost | 257/774 |
| 6,072,700 | * 6/2000 | Nam | 361/783 |

* cited by examiner

*Primary Examiner*—Stephen D. Meier
*Assistant Examiner*—James Mitchell

(57) ABSTRACT

A package for an integrated circuit is disclosed. The package comprises two layers (a top layer and a bottom layer) of flexible tape, each of which has a top surface and a bottom surface, with metal traces on the top surface. A die is mounted on top of the two layers and wire bonds connect bond pads on the die to metal traces on each of the two flexible tapes. The metal traces are routed along the top surfaces of the flexible tapes and are coupled to solder balls through holes in the tapes. These solder balls are mounted along the bottom of the package and serve as the electrical interface to a printed circuit board. Additional holes in the bottom layer tape allow solder balls to extend through the bottom layer tape so that they may be electrically coupled to traces on the top layer tape.

12 Claims, 2 Drawing Sheets

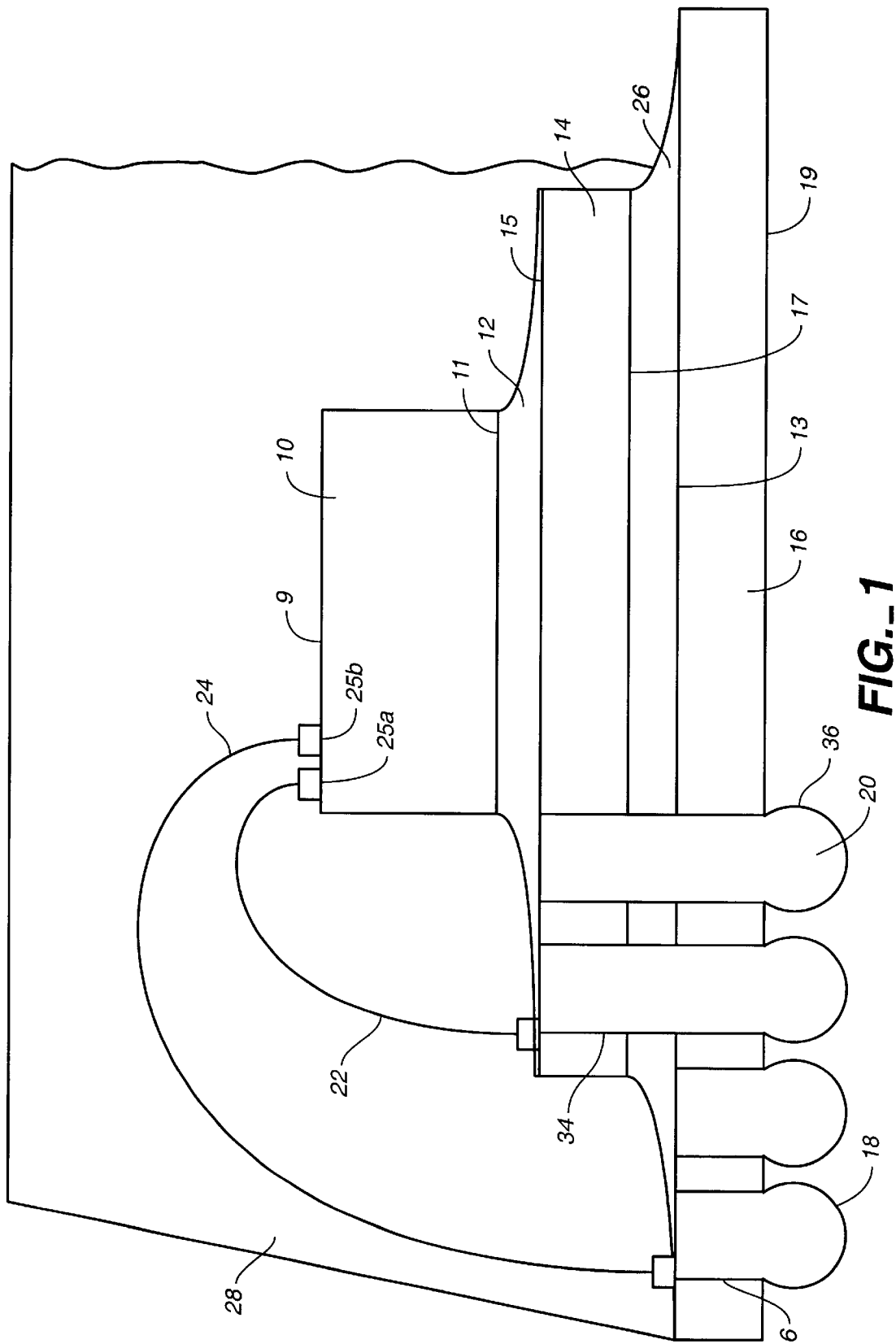
FIG._1

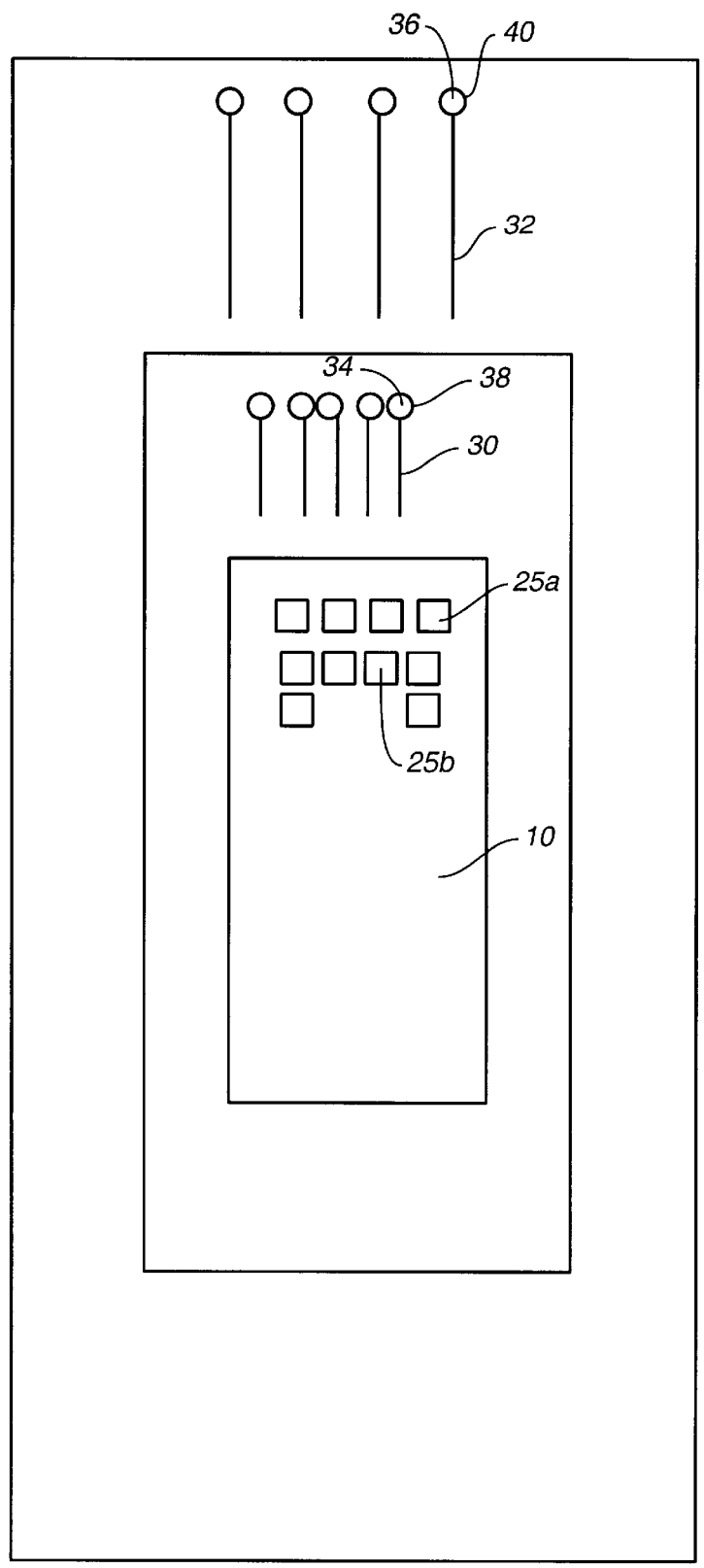
FIG._2

MULTIPLE LAYER TAPE BALL GRID ARRAY PACKAGE

BACKGROUND OF THE INVENTION

1. Field of the Invention

This invention relates generally to semiconductor integrated circuit packages, and more particularly to a flex tape ball grid array package.

2. Description of the Related Art

Tape ball grid array packages (TBGA's) are an increasingly common form of packaging for integrated circuits. TBGA's comprise a flexible plastic tape comprising a dielectric material, such as Kapton, and a metal pattern (traces) formed on the dielectric material. The metal pattern is connected to bond pads on an integrated circuit by a tape automated bonding process or some other process, such as wire bonding as is shown in co-pending application Ser. No. 08/837,686, filed Apr. 21, 1997. Each of the traces is connected to a solder ball, which serves as the electrical interface between the package and a printed circuit board. In this manner, integrated circuit bond pads in TBGA's are electrically coupled to an appropriate solder ball.

The flexible tape material is relatively thin and therefore allows the entire package to be correspondingly thin and lightweight. These characteristics are beneficial for systems that are portable, such as cellular phones and other handheld electronic devices.

The metal pattern mentioned above is typically constructed by laminating a metal foil layer to the tape material or by evaporating metal on the tape material. The metal pattern is then formed by selectively etching away the metal layer. The number of traces that may be created in this fashion for a given area of tape (i.e. the density of traces) is limited by etch techniques. It would be desirable to increase the trace density of conventional TBGS'S.

SUMMARY OF THE INVENTION

The present invention answers the above needs. The present invention comprises a package for an integrated circuit, comprising two layers (a top layer and a bottom layer) of flexible tape, each of which has a top surface and a bottom surface, with metal traces on the top surface. A die is mounted on top of the two layers and wire bonds connect bond pads on the die to metal traces on each of the two flexible tapes. The metal traces are routed along the top surfaces of the flexible tapes and are coupled to solder balls through holes in the tapes. These solder balls are mounted along the bottom of the package and serve as the electrical interface to a printed circuit board. Additional holes in the bottom layer tape allow solder balls to extend through the bottom layer tape so that they may be electrically coupled to traces on the top layer tape.

BRIEF DESCRIPTION OF THE DRAWINGS

Other objects and advantages of the invention will become apparent upon reading the following detailed description and upon reference to the accompanying drawings in which:

FIG. 1 is a cross sectional view of an embodiment of the present invention.

FIG. 2 is an overhead, cut-away view of the package shown in FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a cross sectional view of an embodiment of the present invention. A semiconductor package comprises a first flexible tape 14 that has a top surface 15 and a bottom surface 17 and a second flexible tape 16 that has a top surface 13 and a bottom surface 19. The flexible tapes 14 and 16 preferably comprise Kapton. On each of the flexible tapes 14 and 16, there is a pattern of metal traces 30 and 32 (see FIG. 2) on the top surface 15 and 13 although the metal traces 30 and/or 32 may be on the bottom surfaces 17 and 19 or both the top surface 15 or 13 and the bottom surface 17 or 19. Also, on each of the flexible tapes 14 and 16, holes 34 and 36 (see also FIG. 2) are etched or punched through the tape to allow for attaching solder balls (as will be described below) to pads 38 and 40 (see FIG. 2) on the top surface of the flexible tape substrate in question.

A die 10 has a top surface 9 and a bottom surface 11; a plurality of bond pads 25, shown as bond pads 25a and 25b, are on the top surface 9. (For purposes of clarity, FIG. 1 omits most of the bond pads 25.) The die 10 is mounted such that its bottom surface 11 faces the top surface 15 of the first flexible tape 14. As shown in FIG. 2, an overhead cut-away view of the package, the die 10 is centered with respect to the first flexible tape 14. An adhesive 12 serves to attach the die 10 to the first flexible tape 14.

A first set of 25a of the bond pads 25 are connected by wires 22 to corresponding traces 30 on the first flexible tape 14. The wires 22 may be attached to the traces 30 on the top surface 14 or, as further described in co-pending application, Ser. No. 08/837,686, filed Apr. 21, 1997, may be attached to traces on the bottom surface 17 through holes in the first flexible tape 14. Each of a first plurality of solder balls 20, which serve as the electrical interface between the package and a printed circuit board, is electrically coupled to a corresponding one of the traces 30 on the first flexible tape 14. Each of the first plurality of solder balls 20 extends through one of a plurality of holes 36 in the second flexible tape 16.

The second flexible tape 16 is mounted such that its top surface 13 faces the bottom surface 17 of the first flexible tape 14. The first flexible tape 14, second flexible tape 16 and the die 10 are thus arranged such that at least a portion of the first flexible tape 14 lies in a plane that is both (a) substantially parallel to both the bottom surface 11 of the die 10 and the top surface 13 of the second flexible tape 16, and (b) between the bottom surface of the die 10 and the top surface of the second flexible tape 16. An adhesive 26 serves to attach the first flexible tape 14 to the second flexible tape 16.

As shown in FIG. 2, the length and width of the first flexible tape 14 are each smaller than the length and width of the second flexible tape 16 and the first flexible tape 14 is centered with respect to the second flexible tape 16.

A second set 25b of the bond pads 25 are connected by wires 24 to corresponding traces 32 on the second flexible tape 16. The wires 24 may be attached to the traces 32 on the top surface 13 or, as further described in copending application Ser. No. 08/837,686, filed Apr. 21, 1997, may be attached to traces on the bottom surface 19 through a hole in the second flexible tape 16. Each of a second plurality of solder balls 18 around the periphery of the first plurality of solder balls 20, is electrically coupled to a corresponding one of the traces 32 on the second flexible tape 16.

A molding compound 28 covers the die 10, the first flexible tape 14 and the second flexible tape 16.

CONCLUSION

Numerous variations and modifications will become apparent to those skilled in the art once the above disclosure is fully appreciated. It is intended that the following claims be interpreted to embrace all such variations and modifications.

What is claimed is:

1. A package for an integrated circuit, comprising:
   a first flexible tape having a top surface and a bottom surface, the first flexible tape having metal traces;
   a first plurality of solder balls, each of the first plurality of solder balls electrically coupled to a corresponding one of the traces on the first flexible tape;
   a die having a top surface and a bottom surface, the die having bond pads on its top surface, the die mounted such that its bottom surface faces the top surface of the first flexible tape;
   a first wire connecting a first one of the bond pads on the die with one of the traces on the fist flexible tape;
   a second plurality of solder balls, each of the second plurality of solder balls electrically coupled to a corresponding one of the traces on the second flexible tape;
   a second wire connecting a second one of the bond pads on the die with one of the traces on the second flexible tape; wherein
      at least a portion of the first flexible tape lies in a plane that is both (a) substantially parallel to both the bottom surface of the die and the top surface of the second flexible tape, and (b) between the bottom surface of the die and the top surface of the second flexible tape.

2. The package of claim 1 wherein the first and second flexible tapes each have holes therein and each of the first and second plurality of solder balls, respectively, extend through one of the holes and are attached to a corresponding one of the traces adjacent to the hole.

3. The package of claim 1 wherein the die is mounted such that it is centered with respect to the first flexible tape.

4. The package of claim 2 wherein the second flexible tape is rectangular in shape defining a length and a width, respectively, that are greater than the length and width, respectively, of the first flexible tape.

5. The package of claim 4 wherein the first flexible tape is mounted such that it is centered with respect to the second flexible tape.

6. The package of claim 1 wherein the first flexible tape is rectangular in shape, the shape defined by a length and a width.

7. The package of claim 1 wherein the second flexible tape has a hole therein and one of the first plurality of solder balls extends through the hole.

8. The package of claim 1 further comprising an adhesive attaching the bottom of the first flexible tape to the top of the second flexible tape.

9. The package of claim 1 further comprising an adhesive attaching the top of the first flexible tape to the bottom surface of the die.

10. The package of claim 1 further comprising a molding compound that covers the die, the first flexible tape and the second flexible tape.

11. The package of claim 1 wherein the first flexible tape has traces on its top sides.

12. The package of claim 1 wherein the second flexible tape traces on its top side.

* * * * *